(12) United States Patent
Shin et al.

(10) Patent No.: US 11,563,067 B2
(45) Date of Patent: Jan. 24, 2023

(54) DISPLAY DEVICE WITH IMPROVED APERTURE RATIO AND TRANSMISSIVITY

(71) Applicant: LG DISPLAY CO., LTD., Seoul (KR)

(72) Inventors: Kiseob Shin, Paju-si (KR); Euitae Kim, Daegu (KR); Soyi Lee, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 161 days.

(21) Appl. No.: 16/710,880

(22) Filed: Dec. 11, 2019

(65) Prior Publication Data

US 2020/0194510 A1    Jun. 18, 2020

(30) Foreign Application Priority Data

Dec. 17, 2018 (KR) .......................... 10-2018-0163445

(51) Int. Cl.
*H01L 27/32* (2006.01)
*H01L 51/52* (2006.01)

(52) U.S. Cl.
CPC ........ *H01L 27/326* (2013.01); *H01L 27/3246* (2013.01); *H01L 27/3248* (2013.01); *H01L 51/5237* (2013.01)

(58) Field of Classification Search
CPC .............. H01L 27/326; H01L 27/3246; H01L 27/3248; H01L 51/5237
USPC ......................................................... 257/40
See application file for complete search history.

(56) References Cited

U.S. PATENT DOCUMENTS

| 2014/0183479 A1* | 7/2014 | Park .................... H01L 27/3216 257/40 |
| 2018/0122877 A1* | 5/2018 | Beak ................... H01L 27/3262 |
| 2018/0182836 A1 | 6/2018 | Beak et al. |

FOREIGN PATENT DOCUMENTS

| CN | 108022948 A | 5/2018 |
| CN | 108242457 A | 7/2018 |
| JP | 2011-186427 A | 9/2011 |
| JP | 2018-92929 A | 6/2018 |
| KR | 10-2015-0075017 A | 7/2015 |

* cited by examiner

*Primary Examiner* — Xia L Cross
(74) *Attorney, Agent, or Firm* — Birch, Stewart, Kolasch & Birch, LLP

(57) ABSTRACT

A display device can include a thin-film transistor (TFT) and an auxiliary electrode disposed on a substrate and spaced apart from each other, a passivation layer disposed on the TFT and the auxiliary electrode, a first barrier rib and a second barrier rib disposed on the passivation layer and spaced apart from each other, a first electrode disposed on the first barrier rib and connected to the TFT, a connecting electrode disposed on the second barrier rib and connected to the auxiliary electrode, a bank layer disposed on the passivation layer and including a first opening exposing a portion of the first electrode and a second opening exposing a portion of the connecting electrode, an organic emitting layer disposed on the first electrode and separated by the second barrier rib, and a second electrode disposed on the organic emitting layer and contacting the connecting electrode near the second barrier rib.

18 Claims, 12 Drawing Sheets

DISPLAY DEVICE WITH IMPROVED APERTURE RATIO AND TRANSMISSIVITY

CROSS-REFERENCE TO RELATED APPLICATION

This application claims the priority benefit of Korean Patent Application No. 10-2018-0163445 filed on Dec. 17, 2018 in the Republic of Korea, which are incorporated herein by reference for all purposes as if fully set forth herein.

BACKGROUND OF THE INVENTION

Field of the Invention

The present invention relates to a display device, and more particularly, to a display device capable of improving aperture ratio and transmissivity and reducing manufacturing costs.

Related Art

With the development of the information society, various demands for display devices for displaying images are on the rise. In the field of display devices, flat panel display devices (FPDs), which are thin and lightweight and can be formed in large sizes, have been rapidly replacing cathode ray tubes (CRTs), which are bulky. The flat panel display devices include liquid-crystal displays (LCDs), plasma display panels (PDPs), organic light-emitting displays (OLEDs), electrophoretic display devices (EDs), etc.

Among these types of displays, the organic light-emitting displays are self-luminous devices, and have fast response time, high light emission efficiency, great brightness, and wide viewing angles. Notably, the organic light-emitting displays can be fabricated on a flexible substrate, and have advantages over plasma display panels or inorganic electroluminescence (EL) displays in that they can operate at a low voltage, have lower power consumption, and deliver vivid color reproduction.

More recently, transparent displays are being developed which allow the user to see what is shown on the back of the display through the front of the display. An example of a transparent display is a transparent organic light-emitting display which comprises sub-pixels for emitting light and a transmissive portion through which external light passes. The sub-pixels and the transmissive portion are in a trade-off relationship in which the transmissive portion gets smaller as the sub-pixels get larger or the sub-pixels get smaller as the transmissive portion gets larger. As a result, it is difficult to increase the aperture ratios of the sub-pixels and the transmissive portion.

SUMMARY OF THE INVENTION

The present invention provides a display device capable of improving aperture ratio and transmissivity and reducing manufacturing costs by increasing the area of contact between a second electrode and an auxiliary electrode.

A display device according to an exemplary embodiment of the present invention can include at least one thin-film transistor and an auxiliary electrode disposed on a substrate and spaced apart from each other; a passivation layer disposed on the at least one thin-film transistor and the auxiliary electrode; a first barrier rib and a second barrier rib disposed on the passivation layer and spaced apart from each other; a first electrode disposed on the first barrier rib and connected to the at least one thin-film transistor; a connecting electrode disposed on the second barrier rib and connected to the auxiliary electrode; a bank layer disposed on the passivation layer and comprising a first opening exposing a portion of the first electrode and a second opening exposing a portion of the connecting electrode; an organic emitting layer disposed on the first electrode and separated by the second barrier rib; and a second electrode disposed on the organic emitting layer and coming into contact with the connecting electrode near the second barrier rib.

The first barrier rib overlaps the at least one thin-film transistor.

The organic emitting layer includes an organic light emitting layer and organic common layers At least one of the first barrier rib and the second barrier rib has a reverse tapered shape.

The first electrode can cover a side portion and/or top portion of the first barrier rib, and can be connected to the at least one thin-film transistor through a first via hole present in the passivation layer.

The display device can further include a light-emitting portion where the first electrode, the organic emitting layer, and the second electrode overlap, wherein the light-emitting portion can overlap the first barrier rib.

The connecting electrode can cover a side portion and/or top portion of the second barrier rib, and can be connected to the auxiliary electrode through a second via hole present in the passivation layer.

The connecting electrode can be exposed by separating the organic emitting layer on a side portion of the second barrier rib, and the second electrode can come into contact with the connecting electrode exposed on a side portion of the second barrier rib.

The connecting electrode can be exposed by separating the organic emitting layer on a surface of the passivation layer overlapping the second barrier rib, and the second electrode can come into contact with the connecting electrode exposed on the surface of the passivation layer.

A sub-pixel and a transmissive portion can be defined on the substrate, the sub-pixel comprising a light-emitting portion, wherein the at least one thin-film transistor, the auxiliary electrode, the first barrier rib, the second barrier rib, the first electrode, and the connecting electrode can be provided in the sub-pixel.

The first and second openings of the bank layer are disposed in the sub-pixel, while the bank layer is disposed in the transmissive portion.

The bank layer can include a third opening exposing the transmissive portion, and the transmissive portion is devoid of the bank layer In the transmissive portion, the organic emitting layer is disposed directly on the passivation layer.

The light-emitting portion can overlap the first barrier rib.

The display device further comprise a capacitor, the first barrier rib can overlap the capacitor.

the first opening exposes a portion of the first electrode on top of the first barrier rib.

The display device according to an exemplary embodiment of the present invention includes a plurality of sub-pixels and at least one transmissive portion disposed on a substrate, one of the sub-pixels including a thin-film transistor and an organic light emitting diode (OLED) electrically connected to the thin-film transistor; a passivation layer disposed on the thin-film transistor; a first barrier rib disposed on the passivation layer and overlapping a portion of the thin-film transistor, wherein a first electrode of the OLED is disposed on top and/or side portions of the first barrier rib, an organic emitting layer of the OLED is disposed on the first electrode, and a second electrode of the OLED is disposed on the organic emitting layer; and a bank layer disposed on the first electrode and the passivation layer, and including a first opening in which the first electrode and the first barrier rib are disposed.

The display device further comprises a second barrier rib spaced apart from the first barrier rib, and disposed on the passivation layer; and a connecting electrode disposed on a top and/or side of the second barrier rib and connected to an auxiliary electrode.

At least one of the first barrier rib and the second barrier rib has a reverse tapered shape.

The bank layer comprises a second opening exposing the transmissive portion, such that the transmissive portion is devoid of the bank layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DESCRIPTION OF THE EMBODIMENTS

Figure 1:
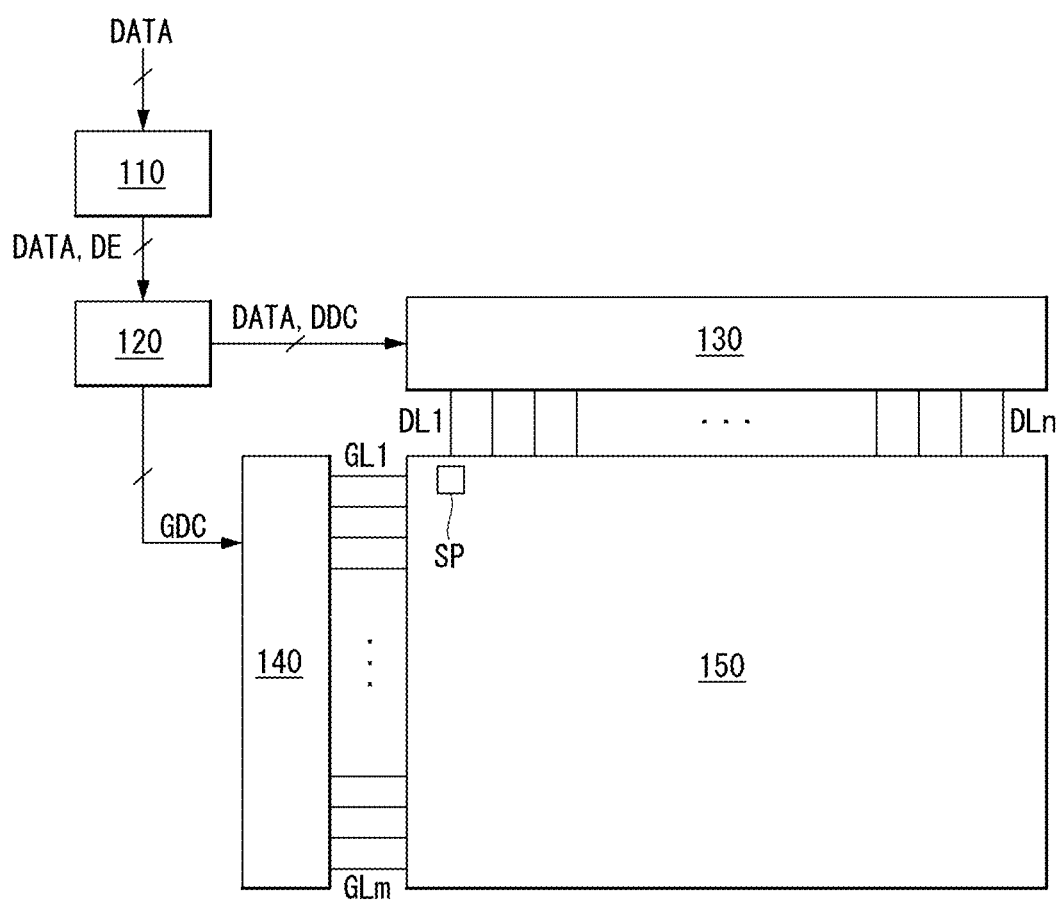
FIG. 1 is a schematic block diagram of an organic light-emitting display.

Hereinafter, exemplary embodiments of the present invention will be described in detail with reference to the attached drawings. Throughout the specification, like reference numerals denote substantially like components. In describing the present invention, a detailed description of known functions or configurations related to the present invention will be omitted when it is deemed that they can unnecessarily obscure the subject matter of the present invention. The names of the elements used in the following description can be selected for ease of writing the specification, and can be different from the names of parts in actual products.

A display device according to one or more embodiments of the present invention is a display device in which display elements are formed on a glass substrate or flexible substrate. Although examples of the display device comprise an organic light-emitting display, a liquid-crystal display, and an electrophoretic display, etc., the present invention will be described with respect to an organic light-emitting display. The organic light-emitting display comprises an organic emitting layer composed of organic materials situated between a first electrode as an anode and a second electrode as a cathode. A hole from the first electrode and an electron from the second electrode recombine within the organic emitting layer, forming an exciton, i.e., a hole-electron pair. Then, energy is created as the exciton returns to the ground state, thereby causing the display device to emit light itself.

A display device according to one or more embodiments of the present invention is a top-emission organic light-emitting display. The top-emission organic light-emitting display is configured in such a way that light emitted from an emissive layer exits through an overlying transparent second electrode.

Hereinafter, embodiments of the present invention will be described with reference to the attached drawings.

Figure 2:
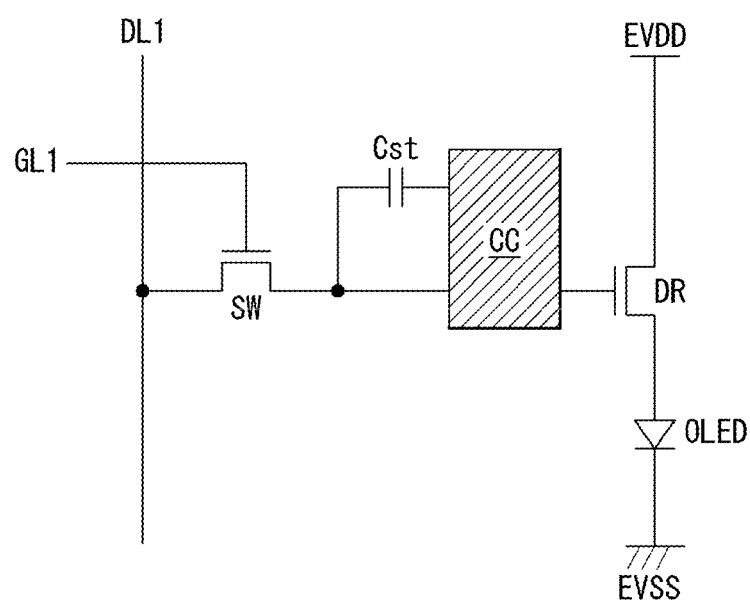
FIG. 2 is a schematic circuit diagram of a sub-pixel in the organic light-emitting display of FIG. 1.
Figure 3:
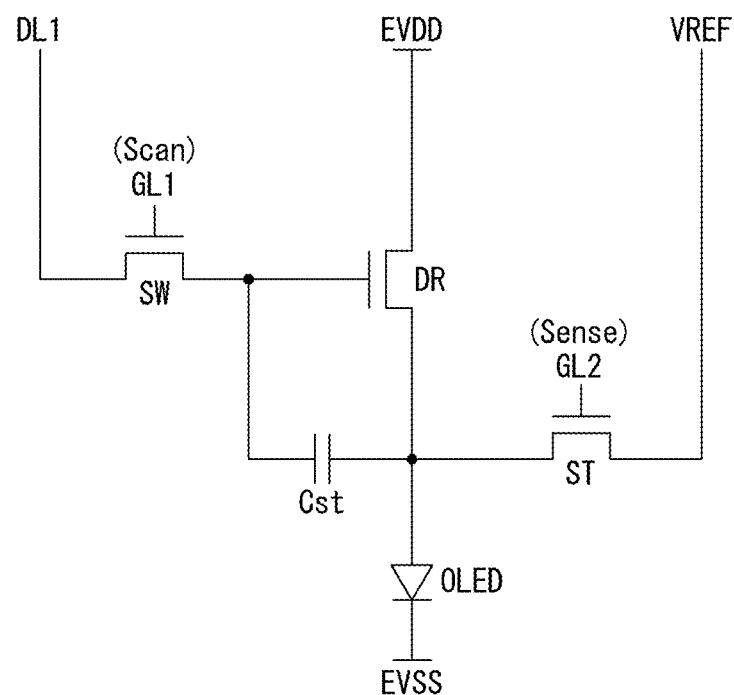
FIG. 3 illustrates a detailed circuit diagram of the sub-pixel of FIG. 2.

FIG. 1 is a schematic block diagram of an organic light-emitting display according to an embodiment of the present invention. FIG. 2 is a schematic circuit diagram of a sub-pixel in the organic light-emitting display of FIG. 1. FIG. 3 illustrates a detailed circuit diagram of the sub-pixel of FIG. 2.

As shown in FIG. 1, the organic light-emitting display comprises an image processor 110, a timing controller 120, a data driver 130, a scan driver 140, and a display panel 150.

The image processor 110 outputs a data enable signal DE, etc., along with an externally supplied data signal DATA. The image processor 110 can output one or more signals among a vertical synchronization signal, a horizontal synchronization signal, and a clock signal, in addition to the data enable signal DE, but these signals are not shown in the drawings for convenience of explanation.

The timing controller 120 receives the data signal DATA from the image processor 110, along with the data enable signal DE or driving signals including the vertical synchronization signal, horizontal synchronization signal, and/or clock signal. Based on the driving signals, the timing controller 120 outputs a gate timing control signal GDC for controlling the operation timing of the scan driver 140 and a data timing control signal DDC for controlling the operation timing of the data driver 130.

In response to the data timing control signal DDC supplied from the timing controller 120, the data driver 130 samples and latches the data signal DATA supplied form the timing controller 120, converts it to a gamma reference voltage, and outputs the gamma reference voltage. The data driver 130 outputs the data signal DATA through data lines DL1 to DLn, where n is a number, e.g., a positive integer. The data driver 130 can be formed in the form of an IC (integrated circuit).

In response to the gate timing control signal GDC supplied from the timing controller 120, the scan driver 140 outputs a scan signal. The scan driver 140 outputs the scan signal through gate lines GL1 to GLm, where m is a number, e.g., a positive integer. The scan driver 140 is formed in the form of an IC (integrated circuit), or is formed on the display panel 150 by a gate-in-panel (GIP) technology.

The display panel 150 displays an image, corresponding to the data signal DATA and scan signal respectively supplied from the data driver 130 and scan driver 140. The display panel 150 comprises sub-pixels SP which work to display an image.

The sub-pixels SP comprise red sub-pixels, green sub-pixels, and blue sub-pixels, or comprise white sub-pixels, red sub-pixels, green sub-pixels, and blue sub-pixels, or other combinations are possible. The sub-pixels SP can have one or more different emission areas depending on their emission characteristics.

As shown in FIG. 2, each sub-pixel SP can comprise a switching transistor SW, a driving transistor DR, a capacitor Cst, a compensation circuit CC, and an organic light emitting diode OLED.

In response to a scan signal supplied through the first gate line GL1, the switching transistor SW performs a switching operation so that a data signal supplied through the first data line DL1 is stored as a data voltage in the capacitor Cst. The driving transistor DR operates in such a way that a driving current flows between a power supply line EVDD (e.g., high-potential voltage) and a cathode power supply line EVSS (e.g., low-potential voltage) in response to the data voltage stored in the capacitor Cst. The organic light-emitting diode OLED operates in such a way as to emit light by the driving current formed by the driving transistor DR.

The compensation circuit CC is a circuit that can be added into the sub-pixel SP to compensate for the threshold voltage, etc. of the driving transistor DR. The compensation circuit CC comprises one or more transistors. The compensation circuit CC has a wide variety of configurations depending on the external compensation method, and an example of this will be described below referring to FIG. 3.

As shown in FIG. 3, the compensation circuit CC can comprise a sensing transistor ST and a sensing line VREF (or reference line). A source electrode or drain electrode of the sensing transistor ST is connected between a source electrode of the driving transistor DR and the anode (hereinafter, sensing node) of the organic light-emitting diode OLED. The sensing transistor ST operates in such a way as to supply a reset voltage (or sensing voltage) delivered through the sensing line VREF to the sensing node of the driving transistor DR or to sense a voltage or current at the sensing node of the driving transistor DR or at the sensing line VREF.

A source electrode or drain electrode of the switching transistor SW is connected to a data line DL, and the other one between the source electrode and drain electrode of the switching transistor SW is then connected to a gate electrode of the driving transistor DR. A source electrode or drain electrode of the driving transistor DR is connected to the power supply line EVDD, and the other one between the source electrode and drain electrode of the driving transistor DR is connected to the anode of the organic light-emitting diode OLED. An electrode of the capacitor Cst is connected to the gate electrode of the driving transistor DR, and the other electrode of the capacitor Cst is connected to the anode of the organic light-emitting diode OLED. A first electrode (i.e., anode) of the organic light-emitting diode OLED is connected to the other one between the source and drain electrodes of the driving transistor DR, and a second electrode (i.e., cathode) of the organic light-emitting diode OLED is connected to the second power supply line EVSS. A source electrode or drain electrode of the sensing transistor ST is connected to the sensing line VREF, and the other one between the source and drain electrodes of the sensing transistor ST is connected to the first electrode, i.e., sensing node, of the organic light-emitting diode OLED and the other one between the source and drain source electrodes of the driving transistor DR.

The operating time of the sensing transistor ST can be similar/identical to or different from the operating time of the switching transistor SW according to an external compensation algorithm (or the configuration of the compensation circuit). For example, the gate electrode of the switching transistor SW can be connected to the first gate line GL1, and the gate electrode of the sensing transistor ST can be connected to the second gate line GL2. In this case, a scan signal Scan is transmitted to the first gate line GL1, and a sensing signal Sense is transmitted to the second gate line GL2. In another example, the first gate line GL1 connected to the gate electrode of the switching transistor SW and the second gate line GL2 connected to the gate electrode of the sensing transistor ST can be connected to be shared in common.

The sensing line VREF can be connected to the data driver. In this case, the data driver can sense the sensing node of the sub-pixel in real time, during an image non-display period, or for a period of N frames (N being an integer equal to or greater than 1) and generate a sensing result. Meanwhile, the switching transistor SW and the sensing transistor ST can be turned on at the same time. In this case, a sensing operation through the sensing line VREF and a data output operation for outputting a data signal are distinguished from each other on the basis of a time-division method of the data driver.

A digital data signal, an analog data signal, or a gamma voltage can be compensated according to the sensing result. Also, a compensation circuit that generates a compensation signal (or compensation voltage) based on the sensing result can be implemented within the data driver, within the timing controller, or as a separate circuit.

Besides, although FIG. 3 illustrates an example in which each sub-pixel has a 3T(transistor)1C(capacitor) structure comprising a switching transistor SW, a driving transistor DR, a capacitor Cst, an organic light-emitting diode OLED, and a sensing transistor ST, each sub-pixel can have various alternative structures like 3T2C, 4T2C, 5T1C, 6T2C, etc. if the compensation circuit CC is added to the sub-pixel.

Figure 4:
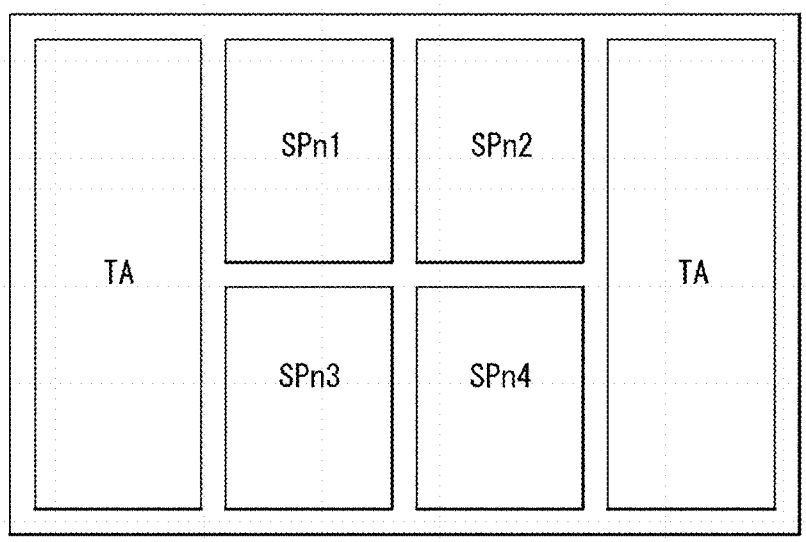
FIG. 4 is a plan view schematically showing a layout of sub-pixels of an organic light-emitting display according to an embodiment of the present invention.
Figure 5:
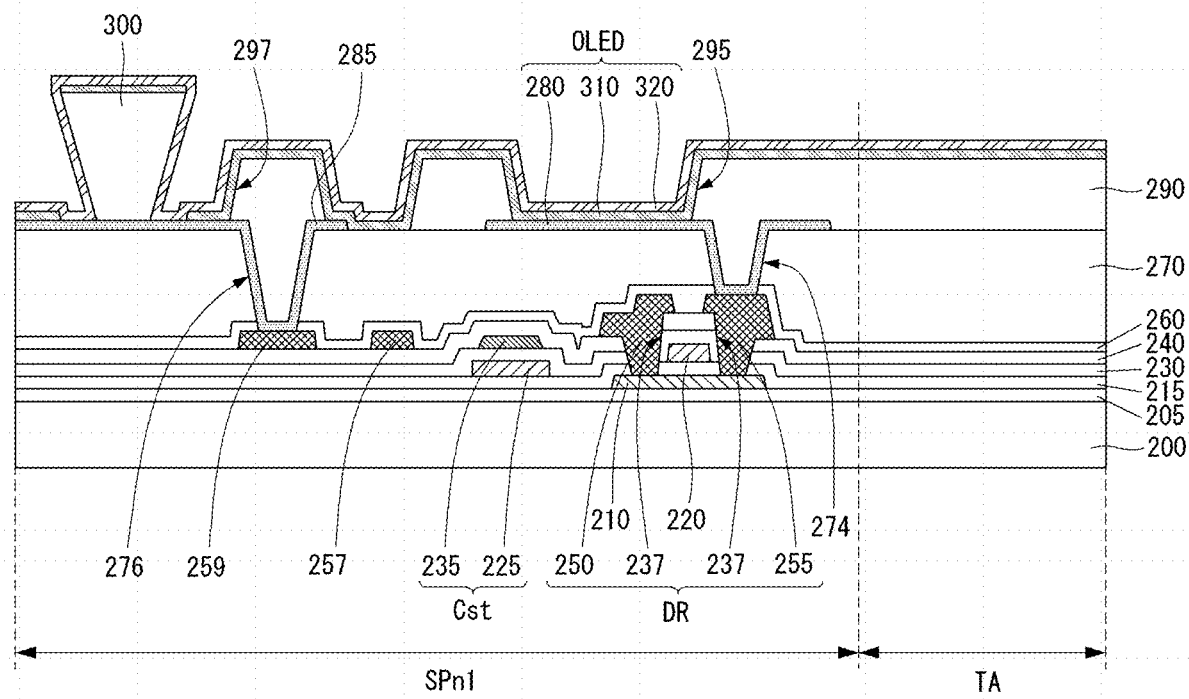
FIG. 5 is a cross-sectional view showing a sub-pixel according to a comparative example of the present invention.
Figure 6:
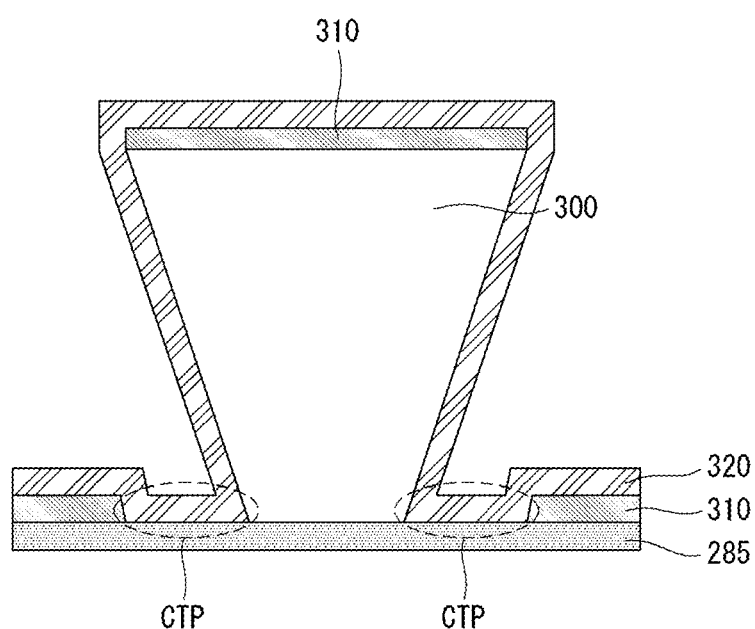
FIG. 6 is an enlarged cross-sectional view of a barrier rib region according to the comparative example of the present invention.

FIG. 4 is a plan view schematically showing a layout of sub-pixels of an organic light-emitting display according to an embodiment the present invention. FIG. 5 is a cross-sectional view showing a sub-pixel according to a comparative example of the present invention. FIG. 6 is an enlarged cross-sectional view of a barrier rib region according to the comparative example of the present invention.

Referring to FIG. 4, the organic light-emitting display according to an example of the present invention is a transparent display that allows the user to see what is shown on the back of the display through the front of the display. The transparent organic light-emitting display comprises a plurality of sub-pixels, e.g., first to fourth sub-pixels SPn1 to SPn4 for emitting light and one or more transmissive portions TA through which external light passes.

In this example, the first to fourth sub-pixels SPn1 to SPn4 are arranged in two rows, with two sub-pixels in each column—that is, a total of four sub-pixels constitute one pixel. The first to fourth sub-pixels SPn1 to SPn4 emit red (R), white (W), blue (B), and green (G) light, respectively, and form one pixel P. However, the arrangement sequence of the sub-pixels can vary depending on the light-emitting materials, the light emission area, the configuration (or structure) of the compensation circuit, etc. Alternatively, the sub-pixels of red (R), blue (B), and green (G) can form one pixel P, or other variations are possible.

The transmissive portion TA is placed to one side of each of the first to fourth sub-pixels SPn1 to SPn4. For example, one transmissive portion TA is placed to the left side of the first sub-pixel SPn1 and third sub-pixel SPn3, and another transmissive portion TA is placed to the right side of the second sub-pixel SPn2 and fourth sub-pixel SPn4.

A cross-sectional structure of the sub-pixels (e.g., SPn1) and the adjacent transmissive portion will be described with reference to FIG. 5.

Referring to FIG. 5, in the organic light-emitting display according to one comparative example of the present invention, a buffer layer 205 is disposed on a substrate 200. The substrate 200 can be formed of glass, plastic, or metal. The first sub-pixel SPn1 and the transmissive portion TA are defined on the substrate 200. The buffer layer 205 serves to protect thin-film transistors (TFTs) to be formed in a subsequent process from gases leaking out of the substrate 200 or from impurities such as alkali ions. The buffer layer 205 can be a silicon oxide (SiOx), a silicon nitride (SiNx), or multiple layers thereof.

A semiconductor layer 210 is disposed on the buffer layer 205. The semiconductor layer 210 can be formed of silicon semiconductor or oxide semiconductor. The silicon semiconductor can comprise amorphous silicon or crystallized polycrystalline polysilicon. The polycrystalline silicon has a high mobility (for example, more than 100 cm$^2$/Vs), low energy consumption, and excellent reliability. Thus, the polycrystalline silicon can be applied to a gate driver for driving elements and/or multiplexers (MUX) or applied to driving TFTs in pixels. Meanwhile, the oxide semiconductor is suitable for a switching TFT which has a short ON-time and a long OFF-time, because of its low OFF-current. Also, the oxide semiconductor is suitable for a display device which requires low-speed operation and/or low power consumption because the voltage hold time of the pixel can be increased due to the low OFF-current. In addition, the semiconductor layer 210 comprises a drain region and a source region, each containing p-type or n-type impurities, and also comprises a channel between the drain region and the source region.

A gate insulating film 215 is disposed on the semiconductor layer 210. The gate insulating film 215 can be silicon oxide SiOx, silicon nitride SiNx, or multiple layers thereof. A gate electrode 220 is disposed on the gate insulating film 215, corresponding to a certain area of the semiconductor layer 210, that is, a channel into which impurities are not introduced, and a capacitor lower electrode 225 is disposed in a region that is spaced a given distance apart from the gate electrode 220. The gate electrode 220 and the capacitor lower electrode 225 can be formed of any one selected from the group consisting of molybdenum (Mo), aluminum (Al), chrome (Cr), gold (Au), titanium (Ti), nickel (Ni), neodymium (Nd), and copper (Cu) or alloys of these elements. Further, the gate electrode 220 and the capacitor lower electrode 225 can be multiple layers of any one selected from the group consisting of molybdenum (Mo), aluminum (Al), chrome (Cr), gold (Au), titanium (Ti), nickel (Ni), neodymium (Nd), copper (Cu), or multiple layers of alloys of these elements. For example, the gate electrode 220 and the capacitor lower electrode 225 can be formed of dual layers of molybdenum/aluminum-neodymium or molybdenum/aluminum.

A first interlayer insulating film 230 for insulating the gate electrode 220 and the capacitor lower electrode 225 is disposed on the gate electrode 220 and the capacitor lower electrode 225. The first interlayer insulating film 230 can be a silicon oxide film (SiOx), a silicon nitride film (SiNx), or multiple layers thereof. A capacitor upper electrode 235 corresponding to the capacitor lower electrode 225 is disposed on the first interlayer insulating film 230. The capacitor upper electrode 235 can be formed of any one selected from the group consisting of molybdenum (Mo), aluminum (Al), chrome (Cr), gold (Au), titanium (Ti), nickel (Ni), neodymium (Nd), and copper (Cu) or alloys of these elements. Thus, the capacitor lower electrode 225 and the capacitor upper electrode 235 constitute a capacitor Cst.

A second interlayer insulating film 240 is disposed on the first interlayer insulating film 230 to insulate the capacitor upper electrode 235. The second interlayer insulating film 240 can be formed of the same material as the first interlayer insulating film 230. The gate insulating film 215, first interlayer insulating film 230, and second interlayer insulating film 240 are formed with contact holes 237 exposing the semiconductor layer 210.

A drain electrode 250 and a source electrode 255 are disposed on the second interlayer insulating film 240. The drain electrode 250 and the source electrode 255 are connected to the semiconductor layer 210 through the contact holes 237, respectively. The source electrode 255 and the drain electrode 250 can include or consist of a single layer or multiple layers. If the source electrode 255 and the drain electrode 250 include or consist of a single layer, they can be formed of any one selected from the group consisting of molybdenum (Mo), aluminum (Al), chrome (Cr), gold (Au), titanium (Ti), nickel (Ni), neodymium (Nd), and copper (Cu), or an alloy of these elements. On the other hand, if the source electrode 255 and the drain electrode 250 include or consist of multiple layers, they can be formed of two layers of molybdenum/aluminum-neodymium or three layers of titanium/aluminum/titanium, molybdenum/aluminum/molybdenum, or molybdenum/aluminum-neodymium/molybdenum. As such, a driving transistor DR comprising the semiconductor layer 210, gate electrode 220, drain electrode 250, and source electrode 255 is formed.

A data line 257 and an auxiliary electrode 259 are disposed on the second interlayer insulating film 240, in a region spaced apart from the driving transistor DR. The data line 257 and the auxiliary electrode 259 are formed of the same material as the aforementioned source electrode 255. The auxiliary electrode 259 serves to decrease the resistance of a second electrode to be described later and supply low-potential voltage.

A passivation layer 260 is disposed on the substrate 200 comprising the driving transistor DR, data line 257, and auxiliary electrode 259. The passivation layer 260 is an insulating film that protects the underlying elements, and can be a silicon oxide film (SiOx), a silicon nitride film (SiNx), or multiple layers thereof. An overcoat layer 270 is disposed on the passivation layer 260. The overcoat layer 270 can be a planarization film for smoothing out step differences on the underlying structure, and is formed of an organic material such as polyimide, benzocyclobutene-based resin, polyacrylate, etc. A first via hole 274 exposing the source electrode 255 of the driving transistor DR and a second via hole 276 exposing the auxiliary electrode 259 are formed in the overcoat layer 270 and the passivation layer 260.

An organic light-emitting diode OLED is disposed on the overcoat layer 270. More specifically, a first electrode 280 of the OLED is disposed on the overcoat layer 270 having the first via hole 274 formed in it. The first electrode 280 acts as a pixel electrode, and is connected to the source electrode 255 of the driving transistor DR through the first via hole 274. The first electrode 280 is an anode, and can be formed of a transparent conductive material, for example, ITO (indium tin oxide), IZO (indium zinc oxide), or ZnO (zinc oxide). The first electrode 280 is a reflective electrode since the present invention involves a top-emission organic light-emitting display. Thus, the first electrode 280 can further comprise a reflective layer. The reflective layer can be formed of aluminum (Al), copper (Cu), silver (Ag), nickel (Ni), or an alloy of these elements, preferably, APC (silver/palladium/copper alloy).

A connecting electrode 285 is disposed in a region spaced apart from the first electrode 280, e.g., on the overcoat layer 270 having the second via hole 276 formed in it. The connecting electrode 285 is connected to the auxiliary electrode 259 through the second via hole 276. The connecting electrode 285 is formed of the same material as the first electrode 280.

A bank layer 290 for defining a pixel is disposed on the overcoat layer 270 where the first electrode 280 is formed. The bank layer 290 is formed of an organic material such as polyimide, benzocyclobutene-based resin, polyacrylate, etc. The bank layer 290 has a first opening 295 exposing the first electrode 280 and a second opening 297 exposing the connecting electrode 285.

A barrier rib 300 is disposed on the connecting electrode 285 within the second opening 297 of the bank layer 290. The barrier rib 300 acts to pattern an organic emitting layer to be described later and connect a second electrode and the connecting electrode 285. The barrier rib 300 has a reverse tapered shape to pattern the organic layer. The barrier rib 300 is formed of an organic material such as polyimide, benzocyclobutene-based resin, polyacrylate, etc., and can be formed of the same material as the aforementioned bank layer 290.

An organic emitting layer 310 of the OLED is disposed on the substrate 200 where the barrier rib 300 and the bank layer 290 are formed. The organic emitting layer 310 is formed over the surface of the substrate 200 and comes into contact with the first electrode 280 through the first opening 295 of the bank layer 290. Moreover, the organic emitting layer 310 is deposited on top of the barrier rib 300, but is separated by the barrier rib 300 having a reverse tapered shape. The organic emitting layer 310 comprises at least an organic light emitting layer that emits light by the recombination of electrons and holes, and can comprise organic common layers such as one or more selected from among a hole injection layer, a hole transport layer, an electron transport layer, and an electron injection layer.

A second electrode 320 of the OLED is disposed on the organic layer 310. The second electrode 320 is disposed over the surface of the substrate 200, and can be a cathode. The second electrode 320 can be formed of aluminum (Al), silver (Ag), or an alloy of these elements. The second electrode 320 can be formed by CVD (Chemical Vapor Deposition), but is not limited to it and can be formed all the way along the barrier rib 300 without being patterned by the barrier rib 300. The second electrode 320 comes into contact with the connecting electrode 285 exposed near the bottom of the barrier rib 300, thereby electrically connecting the second electrode 320 and the auxiliary electrode 259. Accordingly, through the auxiliary electrode 259, the second electrode 320 has lower resistance and receives low-potential voltage.

Meanwhile, referring to FIG. 6, a contact region CTP between the connecting electrode 285 and the second electrode 320, which is located near the barrier rib 300, is defined by the surface of the connecting electrode 285 near the barrier rib 300. Because the contact region CTP between the connecting electrode 285 and the second electrode 320 is only a part of the surface of the connecting electrode 285, the contact resistance of the connecting electrode 285 and second electrode 320 can be increased. Thus, the area of the contact region CTP can be increased by enlarging the size of the barrier rib 300. However, the size of the sub-pixel SPn1 would get larger as the size of the barrier rib 300 increases, which in turn would make the transmissive portion TA smaller in size, thereby reducing the aperture ratio of the transmissive portion TA.

Moreover, as shown in FIG. 5, the overcoat layer 270 and the bank layer 290 are present in the transmissive portion TA. Due to the properties of the overcoat layer 270 and bank layer 290 formed of an organic material, the transmissivity can be lowered to 88% or less, and light from the device can tend to look yellowish, thus resulting in color fidelity degradation.

Accordingly, a display device capable of improving the aperture ratio and transmissivity of the transmissive portion and improving color fidelity is provided according to the embodiments of the present invention, which will be discussed referring to FIGS. 7-10.

First Exemplary Embodiment

Figure 7:
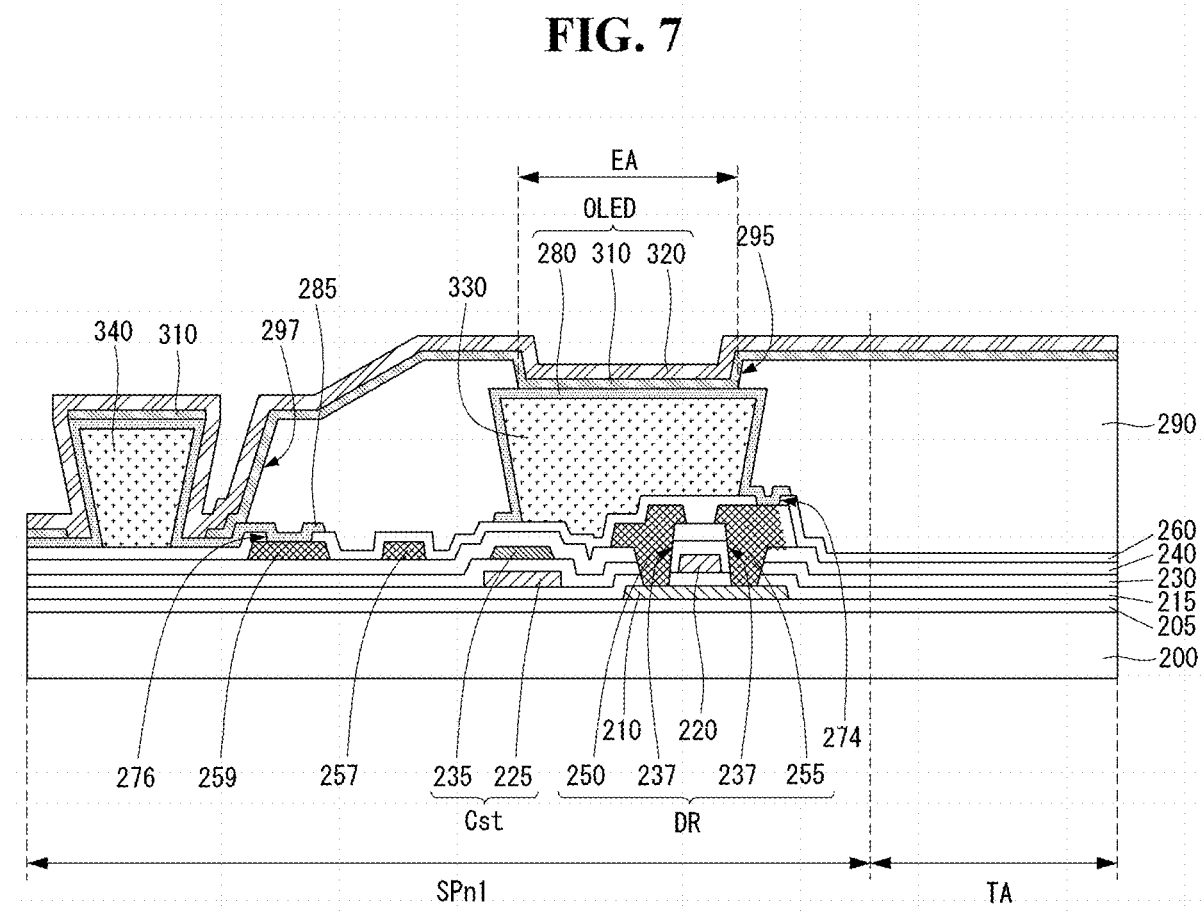
FIG. 7 is a cross-sectional view showing an organic light-emitting display according to a first exemplary embodiment of the present invention.
Figure 8:
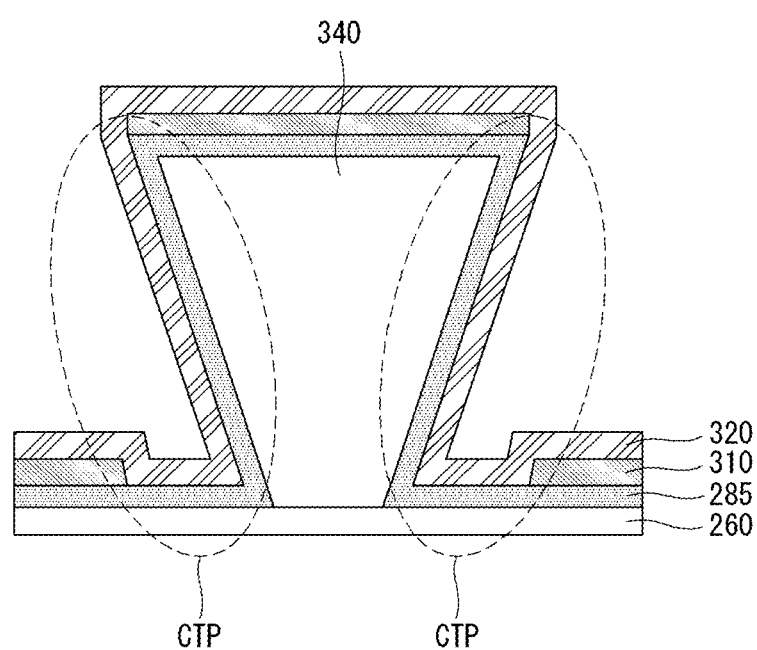
FIG. 8 is an enlarged cross-sectional view of a barrier rib region according to the first exemplary embodiment of the present invention.
Figure 9:
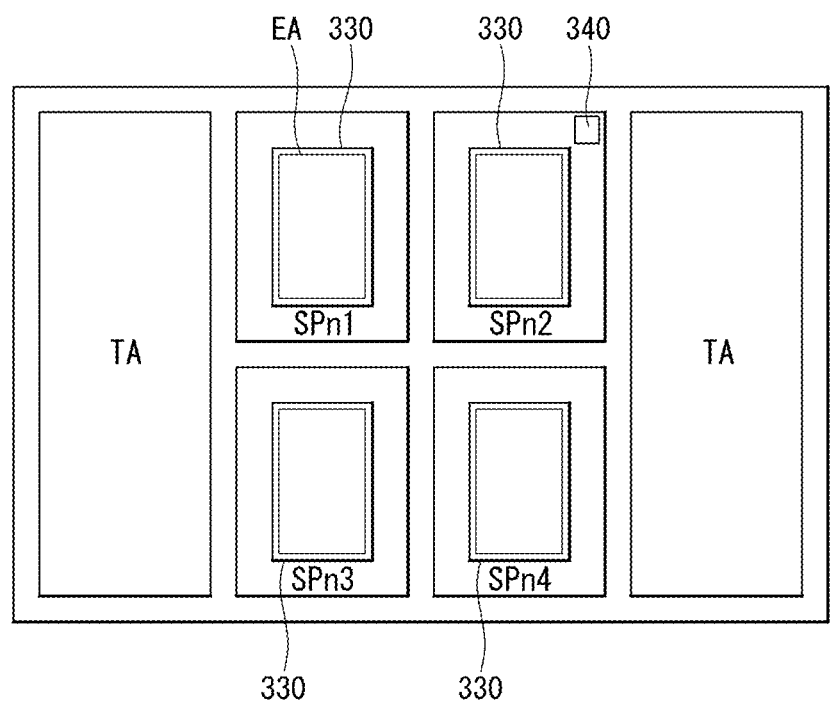
FIG. 9 is a plan view showing a positional relationship between a sub-pixel and a first barrier rib according to the first exemplary embodiment of the present invention.

FIG. 7 is a cross-sectional view showing an organic light-emitting display according to a first exemplary embodiment of the present invention. FIG. 8 is an enlarged cross-sectional view of a barrier rib region according to the first exemplary embodiment of the present invention. FIG. 9 is a plan view showing a positional relationship between a sub-pixel and a first barrier rib according to the first exemplary embodiment of the present invention. The same components as the aforementioned display device are denoted by the same reference numbers, and a brief description thereof will be given below. The configuration(s) in any one or more of FIGS. 7-10 can be used in any other configuration/structure(s) described hereinbelow or shown in FIGS. 7-10. Further, all the components of the organic light-emitting display or any other displays according to all embodiments of the present invention are operatively coupled and configured.

Referring to FIG. 7, in a display device according to the first exemplary embodiment, a plurality of sub-pixels and one or more transmissive portions TAs are provided, e.g., similar to the configuration shown in FIG. 4. In the display of FIG. 7, a first sub-pixel SPn1 and a transmissive portion TA are defined on a substrate 200. A buffer layer 205 is disposed on the substrate 200, and a semiconductor layer 210 is disposed on the buffer layer 205. A gate insulating film 215 is disposed on the semiconductor layer 210. A gate electrode 220 is disposed on the gate insulating film 215, corresponding to a certain area of the semiconductor layer 210, that is, a channel into which impurities are not introduced, and a capacitor lower electrode 225 is disposed in a region spaced a given distance apart from the gate electrode 220.

A first interlayer insulating film 230 for insulating the gate electrode 220 and the capacitor lower electrode 225 is disposed on the gate electrode 220 and the capacitor lower electrode 225. A capacitor upper electrode 235 corresponding to the capacitor lower electrode 225 is disposed on the first interlayer insulating film 230. Thus, the capacitor lower electrode 225 and the capacitor upper electrode 235 constitute a capacitor Cst. A second interlayer insulating film 240 is disposed on the first interlayer insulating film 230 to insulate the capacitor upper electrode 235. The gate insulating film 215, first interlayer insulating film 230, and second interlayer insulating film 240 are formed with contact holes 237 exposing the semiconductor layer 210.

A drain electrode 250 and a source electrode 255 are disposed on the second interlayer insulating film 240. The drain electrode 250 and the source electrode 255 are connected to the semiconductor layer 210 through the contact holes 237, respectively. As such, a driving transistor DR comprising the semiconductor layer 210, gate electrode 220, drain electrode 250, and source electrode 255 is formed.

A data line 257 and an auxiliary electrode 259 are disposed on the second interlayer insulating film 240, in a region spaced apart from the driving transistor DR. The data line 257 and the auxiliary electrode 259 are formed of the same material as the aforementioned source electrode 255. The auxiliary electrode 259 serves to decrease the resistance of a second electrode to be described later and supply low-potential voltage. A passivation layer 260 is disposed on the substrate 200 comprising the driving transistor DR, data line 257, and auxiliary electrode 259.

Meanwhile, a first barrier rib 330 and a second barrier rib 340 are disposed on the passivation layer 260. The first barrier rib 330 is disposed to overlap the driving transistor DR and the capacitor Cst, and the second barrier rib 340 is disposed adjacent to the auxiliary electrode 259. The first barrier rib 330 serves to define an area where a first electrode 280 of an OLED (to be described later) is formed, and the second barrier rib 340 serves to pattern an organic emitting layer (to be described later) and connect the second electrode and the connecting electrode 285. At least one of the first barrier rib 330 and the second barrier rib 340 has a reverse tapered shape, but can have a different shape/configuration. The first barrier rib 330 and the second barrier rib 340 can be formed of an organic material such as polyimide, benzocyclobutene-based resin, polyacrylate, etc.

The first electrode 280 is disposed on the first barrier rib 330, and the connecting electrode 285 is disposed on the second barrier rib 340. The first electrode 280 is configured to surround the first barrier rib 330, and is connected to the source electrode 255 of the driving transistor DR through a first via hole 274 in the passivation layer 260 that is adjacent to it. The first electrode 280 is configured to cover both the side surface and top surface of the first barrier rib 330. The connecting electrode 285 is configured to surround the second barrier rib 340, and is connected to the auxiliary electrode 259 through a second via hole 276 in the passivation layer 260 that is adjacent to it. The connecting electrode 285 is configured to cover both the side surface and top surface of the second barrier rib 340.

A bank layer 290 for defining a pixel is disposed on the passivation layer 260 where the first electrode 280 is formed. The bank layer 290 has a first opening 295 covering the first electrode 280 and exposing the first electrode 280, and a second opening 297 exposing the connecting electrode 285. An organic emitting layer 310 of the OLED is disposed on the substrate 200 where the bank layer 290 is formed. The organic emitting layer 310 is formed over the surface of the substrate 200 and comes into contact with the first electrode 280 through the first opening 295 of the bank layer 290. Moreover, the organic emitting layer 310 is deposited on top of the second barrier rib 340, but is separated by the second barrier rib 340 having a reverse tapered shape.

A second electrode 320 of the OLED is disposed on the organic emitting layer 310. The second electrode 320 is disposed over the surface of the substrate 200, and can be a cathode. The second electrode 320 can be formed by CVD (Chemical Vapor Deposition), but is not limited to it and can be formed all the way along the second barrier rib 340 without being patterned by the second barrier rib 340. The second electrode 320 comes into contact with the connecting electrode 285 exposed near the bottom of the second barrier rib 340, thereby electrically connecting the second electrode 320 and the auxiliary electrode 259. Accordingly, through the auxiliary electrode 259, the second electrode 320 has lower resistance and receives low-potential voltage.

An area where the first electrode 280, organic emitting layer 310, and second electrode 320 overlap is defined as a light-emitting portion EA. The first barrier rib 330 overlaps the light-emitting portion EA since the first barrier rib 330 defines an area where the first electrode 280 is formed.

Referring to FIG. 8 illustrating an enlarged view of the second barrier rib 340 area of FIG. 7, a contact region CTP between the connecting electrode 285 and second electrode 320, which is located near the second barrier rib 340, is defined by the surface of the connecting electrode 285 formed on the side surface of the second barrier rib 340 and the surface of the connecting electrode 285 formed on the passivation layer 260. In other words, the side surface of the second barrier rib 340 and the vicinity of the second barrier rib 340 can correspond to the contact region CTP between the connecting electrode 285 and the second electrode 320, e.g., as shown by the dotted circles in FIG. 8.

When comparing the aforementioned contact region according to the comparative example in FIG. 6 and the contact region according to the exemplary embodiment in FIG. 8, even the side surfaces of the second barrier rib 340 according to the exemplary embodiment can act as the contact region CTP which is increased significantly in comparison to FIG. 6. This offers the advantage of reducing contact resistance by increasing the area of the contact region CTP between the connecting electrode 285 and the second electrode 320 in the example of FIGS. 7 and 8.

Moreover, referring to FIG. 7, in the organic light-emitting display according to the first exemplary embodiment of the present invention, the overcoat layer provided in the comparative example can be omitted, and an area where the first electrode 280 is formed can be defined by the first barrier rib 330. This offers the advantage of improving transmissivity by omitting the overcoat layer in the transmissive portion TA and of improving color fidelity by reducing the emission of yellowish light.

Referring to FIG. 9 illustrating a positional relation between the first barriers, the sub-pixels and the transmissive portions, the first barrier rib 330 can be disposed in each or at least one of the sub-pixels, e.g., in each of sub-pixel SPn1 to sPn4, and the second barrier rib 340 can be disposed in at least one of the sub-pixels, e.g., in one or more of the sub-pixels SPn1 to SPn4. In the example of FIG. 9, the second barrier rib 340 is disposed in the second sub-pixel SPn2. The number of second barrier ribs 340 present in the display can be adjusted to various numbers, but is not specifically limited.

Second Exemplary Embodiment

Figure 10:
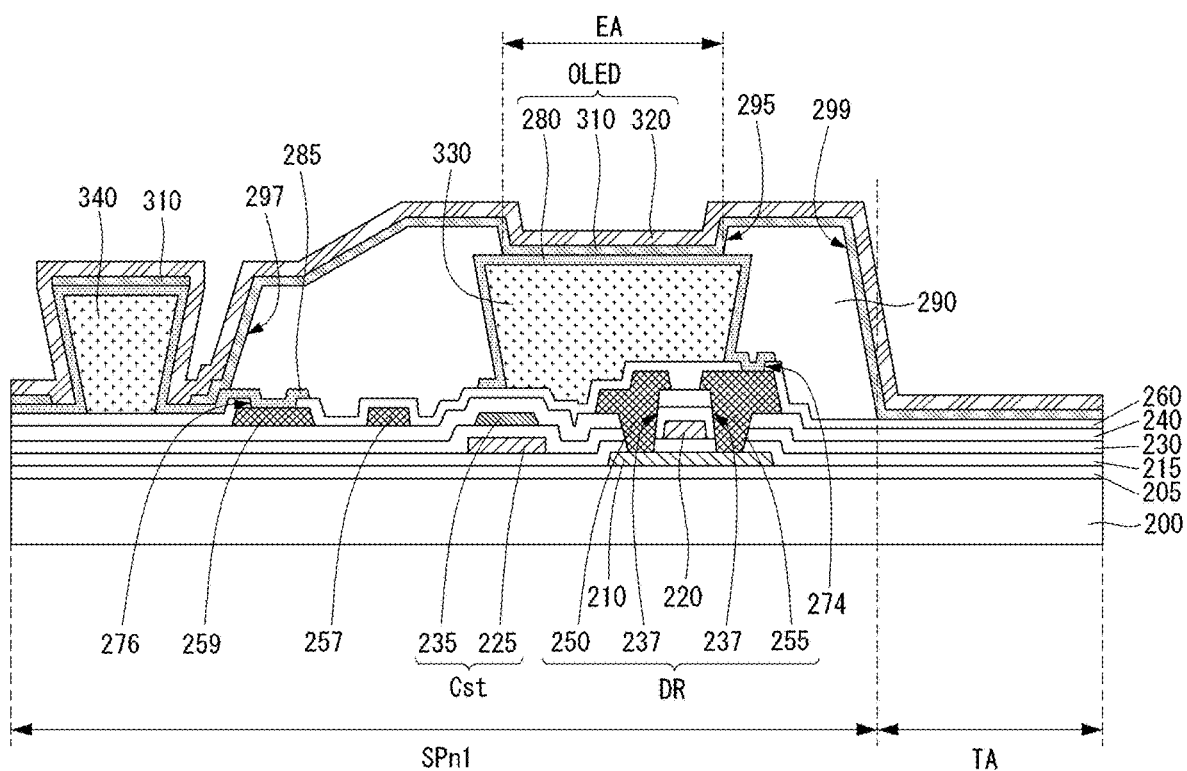
FIG. 10 is a cross-sectional view showing an organic light-emitting display according to a second exemplary embodiment of the present invention.

FIG. 10 is a cross-sectional view showing an organic light-emitting display according to a second exemplary embodiment of the present invention. The same components as the aforementioned display device are denoted by the same reference numbers, and a brief description thereof will be given below. It can be said that the display of FIG. 10 is basically the same as the display of FIG. 7, except for the configuration of a transmissive portion TA and its boundary area, which will be discussed in more detail below.

Referring to FIG. 10, in a display device according to the second exemplary embodiment, a first sub-pixel SPn1 and a transmissive portion TA are defined on a substrate 200. A buffer layer 205 is disposed on the substrate 200, and a semiconductor layer 210 is disposed on the buffer layer 205. A gate insulating film 215 is disposed on the semiconductor layer 210. A gate electrode 220 is disposed on the gate insulating film 215, corresponding to a certain area of the semiconductor layer 210, that is, a channel into which impurities are not introduced, and a capacitor lower electrode 225 is disposed in a region spaced a given distance apart from the gate electrode 220.

A first interlayer insulating film 230 for insulating the gate electrode 220 and the capacitor lower electrode 225 is disposed on the gate electrode 220 and the capacitor lower electrode 225. A capacitor upper electrode 235 corresponding to the capacitor lower electrode 225 is disposed on the first interlayer insulating film 230. Thus, the capacitor lower electrode 225 and the capacitor upper electrode 235 constitute a capacitor Cst. A second interlayer insulating film 240 is disposed on the first interlayer insulating film 230 to insulate the capacitor upper electrode 235. The gate insulating film 215, first interlayer insulating film 230, and second interlayer insulating film 240 are formed with contact holes 237 exposing the semiconductor layer 210.

A drain electrode 250 and a source electrode 255 are disposed on the second interlayer insulating film 240. The drain electrode 250 and the source electrode 255 are connected to the semiconductor layer 210 through the contact holes 237, respectively. As such, a driving transistor DR comprising the semiconductor layer 210, gate electrode 220, drain electrode 250, and source electrode 255 is formed.

A data line 257 and an auxiliary electrode 259 are disposed on the second interlayer insulating film 240, in a region spaced apart from the driving transistor DR. The data line 257 and the auxiliary electrode 259 are formed of the same material as the aforementioned source electrode 255. The auxiliary electrode 259 serves to decrease the resistance of a second electrode to be described later and supply low-potential voltage. A passivation layer 260 is disposed on the substrate 200 comprising the driving transistor DR, data line 257, and auxiliary electrode 259.

Meanwhile, a first barrier rib 330 and a second barrier rib 340 are disposed on the passivation layer 260. The first barrier rib 330 is disposed to overlap the driving transistor DR and the capacitor Cst, and the second barrier rib 340 is disposed adjacent to the auxiliary electrode 259. The first barrier rib 330 serves to define an area where a first electrode 280 of an OLED is to be formed, and the second barrier rib 340 serves to pattern an organic emitting layer to be described later and connect the second electrode and the connecting electrode 285. The first barrier rib 330 and the second barrier rib 340 have a reverse tapered shape. The first barrier rib 330 and the second barrier rib 340 can be formed of an organic material such as polyimide, benzocyclobutene-based resin, polyacrylate, etc.

The first electrode 280 is disposed on the first barrier rib 330, and the connecting electrode 285 is disposed on the second barrier rib 340. The first electrode 280 is configured to surround the first barrier rib 330, and is connected to the source electrode 255 of the driving transistor DR through a first via hole 274 in the passivation layer 260 that is adjacent to it. The first electrode 280 is configured to cover both the side surface and top surface of the first barrier rib 330. The connecting electrode 285 is configured to surround the second barrier rib 340, and is connected to the auxiliary electrode 259 through a second via hole 276 in the passivation layer 260 that is adjacent to it. The connecting electrode 285 is configured to cover both the side surface and top surface of the second barrier rib 340.

A bank layer 290 for defining a pixel is disposed on the passivation layer 260 where the first electrode 280 is formed. The bank layer 290 has a first opening 295 covering the first electrode 280 and exposing the first electrode 280 and a second opening 297 exposing the connecting electrode 285. An organic emitting layer 310 of the OLED is disposed on the substrate 200 where the bank layer 290 is formed. The organic emitting layer 310 is formed over the surface of the substrate 200 and comes into contact with the first electrode 280 through the first opening 295 of the bank layer 290. Moreover, the organic emitting layer 310 is deposited on top of the second barrier rib 340, but separated by the second barrier rib 340 having a reverse tapered shape.

A second electrode 320 of the OLED is disposed on the organic emitting layer 310. The second electrode 320 is disposed over the surface of the substrate 200, and can be a cathode. The second electrode 320 can be formed by CVD (Chemical Vapor Deposition), but is not limited to it and can be formed all the way along the second barrier rib 340 without being patterned by the second barrier rib 340. The second electrode 320 comes into contact with the connecting electrode 285 exposed near the bottom of the second barrier rib 340, thereby electrically connecting the second electrode 320 and the auxiliary electrode 259. Accordingly, through the auxiliary electrode 259, the second electrode 320 has lower resistance and receives low-potential voltage.

Meanwhile, the bank layer 290 in the second exemplary embodiment of the present invention comprises a third opening 299 exposing the transmissive portion TA. For example, the bank layer 290 is not formed in the transmissive portion TA. Due to the properties of its organic material, the bank layer 290 can cause a decrease in transmissivity and may make the light look yellowish, thus possibly resulting in color fidelity degradation. Thus, in the second exemplary embodiment, the third opening 299 exposing the transmissive portion TA is formed in the bank layer 290 so that the bank layer 290 is not formed in the transmissive portion TA. This offers the advantage of improving the transmission of light in the transmissive portion TA and preventing color fidelity degradation.

Figure 11:
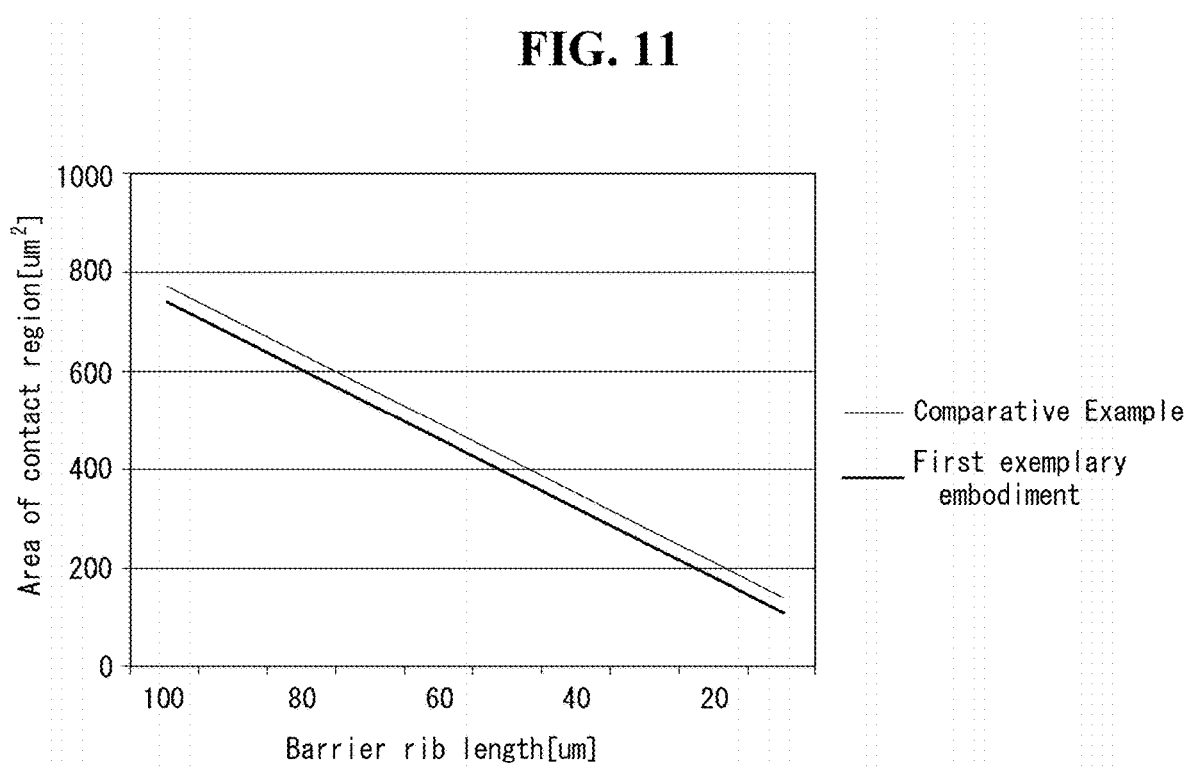
FIG. 11 is a graph showing the area of a contact region versus the length of a barrier rib according to the comparative example and the first exemplary embodiment of the present invention.
Figure 12:
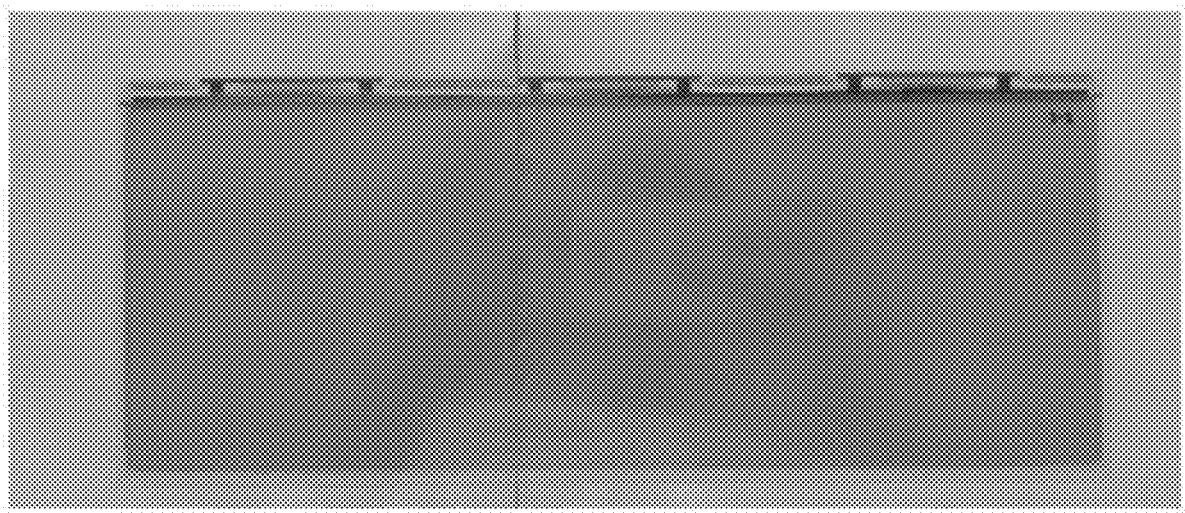
FIG. 12 is an image of an organic light-emitting display manufactured according to the comparative example of the present invention.
Figure 13:
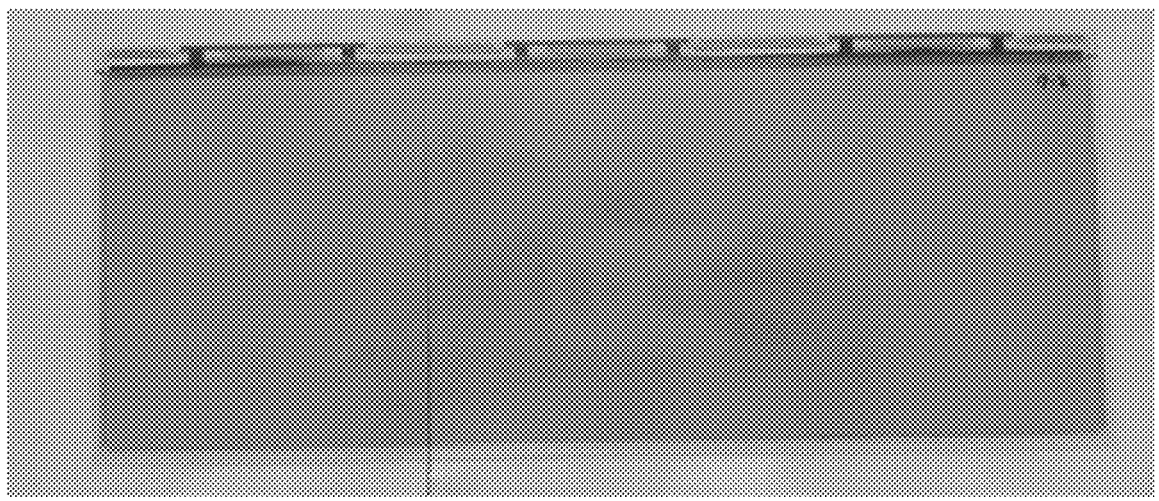
FIG. 13 is an image of an organic light-emitting display manufactured according to the second exemplary embodiment of the present invention.

FIG. 11 is an example of a graph showing the area of a contact region versus the length of a barrier rib according to the comparative example and the first exemplary embodiment of the present invention. FIG. 12 is an image of an organic light-emitting display manufactured according to the comparative example of the present invention. FIG. 13 is an image of an organic light-emitting display manufactured according to the second exemplary embodiment of the present invention.

Referring to FIG. 11, the barrier rib width of the organic light-emitting display according to the comparative example was 10 µm, and the barrier rib width of the organic light-emitting display according to the first exemplary embodiment was 6 µm. In this case, measurements of the area of a contact region between the second electrode and the connecting electrode versus the barrier rib length were taken. The measurements show that the barrier rib width of the organic light-emitting display (in FIG. 7) according to the first exemplary embodiment is 4 μm shorter than the barrier rib width of the organic light-emitting display (in FIG. 5) according to the comparative example, but their contact regions are similar in area for each barrier rib length.

This means that the barrier rib width of the organic light-emitting display according to the first exemplary embodiment can be further reduced, which allows for a reduction in the size of the barrier rib. Accordingly, the reduction in the size of the barrier rib can lead to a further increase in the aperture ratio of the transmissive portion.

Moreover, referring to FIG. 12, the organic light-emitting display device according to the comparative example of the present invention shows a yellowish tint due to the presence of a bank layer in a transmissive portion. However, referring to FIG. 13, the organic light-emitting display device according to the second exemplary embodiment of the present invention has no yellowish tint due to the absence of the bank layer in the transmissive portion.

As discussed above, in the organic light-emitting displays according to the exemplary embodiments of the present invention, a region where the first electrode of the OLED is formed can be defined by the first barrier rib. This offers the advantage of reducing manufacturing costs, improving transmissivity by omitting the overcoat layer in the transmissive portion, and improving color fidelity by reducing the emission of yellowish light.

Another advantage of the organic light-emitting displays according to the exemplary embodiments is that contact resistance can be reduced by increasing the area of the contact region between the connecting electrode and the second electrode of the OLED, because the connecting electrode and the second electrode come into contact with each other even on the side surface of the second barrier rib.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
at least one thin-film transistor and an auxiliary electrode disposed on a substrate and spaced apart from each other;
a passivation layer disposed on the at least one thin-film transistor and the auxiliary electrode;
a first barrier rib and a second barrier rib disposed on the passivation layer and spaced apart from each other;
a first electrode disposed on the first barrier rib and connected to the at least one thin-film transistor;
a connecting electrode disposed on the second barrier rib and connected to the auxiliary electrode;
a bank layer disposed on the passivation layer and comprising a first opening exposing a portion of the first electrode and a second opening exposing a portion of the connecting electrode;
an organic emitting layer disposed on the first electrode and separated by the second barrier rib; and
a second electrode disposed on the organic emitting layer and coming into contact with the connecting electrode near the second barrier rib,
wherein the first barrier rib and the second barrier rib directly contact a top surface of the passivation layer,
wherein at least one of the first barrier rib and the second barrier rib has a reverse tapered shape, and
wherein the first barrier rib and the second barrier rib are formed of an organic insulating material.

2. The display device of claim 1, wherein the first barrier rib overlaps the at least one thin-film transistor.

3. The display device of claim 1, wherein the organic emitting layer includes an organic light emitting layer and organic common layers.

4. The display device of claim 1, wherein the first electrode covers a side portion and/or top portion of the first barrier rib, and is connected to the at least one thin-film transistor through a first via hole present in the passivation layer.

5. The display device of claim 1, further comprising a light-emitting portion where the first electrode, the organic emitting layer, and the second electrode overlap,
wherein the light-emitting portion overlaps the first barrier rib.

6. The display device of claim 1, wherein the connecting electrode covers a side portion and/or top portion of the second barrier rib, and is connected to the auxiliary electrode through a second via hole present in the passivation layer.

7. The display device of claim 1, wherein the connecting electrode is exposed by separating the organic emitting layer on a side portion of the second barrier rib, and the second electrode comes into contact with the connecting electrode exposed on the side portion of the second barrier rib.

8. The display device of claim 7, wherein the connecting electrode is exposed by separating the organic emitting layer on a surface of the passivation layer overlapping the second barrier rib, and the second electrode comes into contact with the connecting electrode exposed on the surface of the passivation layer.

9. The display device of claim 1, wherein a sub-pixel and a transmissive portion adjacent to the sub-pixel are defined on the substrate, the sub-pixel comprising a light-emitting portion,
wherein the at least one thin-film transistor, the auxiliary electrode, the first barrier rib, the second barrier rib, the first electrode, and the connecting electrode are provided in the sub-pixel.

10. The display device of claim 9, wherein the first and second openings of the bank layer are disposed in the sub-pixel, while the bank layer is disposed in the transmissive portion, and
wherein the bank layer is contacted with an upper surface of the first electrode at an upper surface of the first barrier rib.

11. The display device of claim 9, wherein the bank layer comprises a third opening exposing the transmissive portion, so that the transmissive portion is devoid of the bank layer.

12. The display device of claim 9, wherein in the transmissive portion, the organic emitting layer is disposed directly on the passivation layer.

13. The display device of claim 9, wherein the light-emitting portion overlaps the first barrier rib.

14. The display device of claim 1, further comprising a capacitor, wherein the first barrier rib overlaps the capacitor.

15. The display device of claim 1, wherein the first opening exposes a portion of the first electrode on top of the first barrier rib.

16. A display device comprising:

a plurality of sub-pixels and at least one transmissive portion disposed on a substrate, one of the sub-pixels including a thin-film transistor and an organic light emitting diode (OLED) electrically connected to the thin-film transistor;

a passivation layer disposed on the thin-film transistor;

a first barrier rib disposed on the passivation layer and overlapping a portion of the thin-film transistor, wherein a first electrode of the OLED is disposed on top and/or side portions of the first barrier rib, an organic emitting layer of the OLED is disposed on the first electrode, and a second electrode of the OLED is disposed on the organic emitting layer;

a second barrier rib spaced apart from the first barrier rib, and disposed on the passivation layer; and a bank layer disposed on the first electrode and the passivation layer, and including a first opening in which the first electrode and the first barrier rib are disposed, wherein the first barrier rib and the second barrier rib directly contact a top surface of the passivation layer, wherein at least one of the first barrier rib and the second barrier rib has a reverse tapered shape, and wherein the first barrier rib and the second barrier rib are formed of an organic insulating material.

17. The display device of claim 16, further comprising:

a connecting electrode disposed on a top and/or side of the second barrier rib and connected to an auxiliary electrode.

18. The display device of claim 16, wherein the bank layer comprises a second opening exposing the transmissive portion, so that the transmissive portion is devoid of the bank layer, and wherein the bank layer is contacted with an upper surface of the first electrode at an upper surface of the first barrier rib.

* * * * *